(12) United States Patent
Su et al.

(10) Patent No.: US 8,716,049 B2
(45) Date of Patent: May 6, 2014

(54) GROWTH OF GROUP III-V MATERIAL LAYERS BY SPATIALLY CONFINED EPITAXY

(75) Inventors: Jie Su, Santa Clara, CA (US); Olga Kryliouk, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 194 days.

(21) Appl. No.: 13/025,971

(22) Filed: Feb. 11, 2011

(65) Prior Publication Data

US 2011/0204378 A1  Aug. 25, 2011

Related U.S. Application Data

(60) Provisional application No. 61/307,314, filed on Feb. 23, 2010.

(51) Int. Cl.
*H01L 29/20* (2006.01)
*H01L 33/02* (2010.01)

(52) U.S. Cl.
USPC ............. 438/47; 438/478; 438/479; 438/507; 438/509; 257/76; 257/615; 257/94; 257/E33.023; 257/E29.089

(58) Field of Classification Search
CPC ............... H01L 33/32; H01L 21/0254; H01L 21/02458; H01L 33/30; H01L 21/0262; H01L 29/2003
USPC ............. 257/76, 615, 94, E33.023, E29.089; 438/47, 478, 479, 507, 459

See application file for complete search history.

(56) References Cited

U.S. PATENT DOCUMENTS

| | | | |
|---|---|---|---|
| 5,830,538 A * | 11/1998 | Gates et al. ................. | 427/535 |
| 6,621,148 B2 * | 9/2003 | Linthicum et al. ............ | 257/623 |
| 6,692,568 B2 | 2/2004 | Cuomo et al. | |
| 6,818,465 B2 * | 11/2004 | Biwa et al. ...................... | 438/22 |
| 7,205,168 B2 * | 4/2007 | Oohata et al. .................. | 438/22 |
| 7,338,828 B2 * | 3/2008 | Imer et al. ...................... | 438/46 |
| 7,928,447 B2 * | 4/2011 | Matsuoka et al. .............. | 257/79 |
| 2004/0048409 A1 * | 3/2004 | Biwa et al. ...................... | 438/46 |
| 2004/0113166 A1 | 6/2004 | Tadatomo et al. | |
| 2004/0206299 A1 | 10/2004 | Tadatomo et al. | |
| 2005/0040407 A1 | 2/2005 | Kohda | |
| 2005/0064206 A1 | 3/2005 | Akita et al. | |
| 2006/0118802 A1 | 6/2006 | Lee et al. | |
| 2009/0174038 A1 | 7/2009 | Wang | |
| 2009/0243043 A1 * | 10/2009 | Wang ............................. | 257/615 |
| 2011/0012235 A1 * | 1/2011 | Iwata et al. .................... | 257/615 |
| 2011/0163323 A1 * | 7/2011 | Motoki et al. ................. | 257/76 |
| 2011/0198625 A1 * | 8/2011 | Yoon et al. ..................... | 257/88 |
| 2011/0226937 A1 * | 9/2011 | Yu et al. ........................ | 250/216 |

OTHER PUBLICATIONS

International Search Report and Written Opinion from PCT/US2011/025063 mailed Sep. 29, 2011, 11 pgs.
International Preliminary Report on Patentability from PCT/US2011/025063 mailed Sep. 7, 2012, 7 pgs.

* cited by examiner

*Primary Examiner* — Thinh T Nguyen
(74) *Attorney, Agent, or Firm* — Blakely Sokoloff Taylor Zafman LLP (57) ABSTRACT

Techniques for crack-free growth of GaN, and related, films on larger-size substrates via spatially confined epitaxy are described.

20 Claims, 8 Drawing Sheets

GROWTH OF GROUP III-V MATERIAL LAYERS BY SPATIALLY CONFINED EPITAXY

CROSS-REFERENCE TO RELATED APPLICATIONS

This application claims the benefit of U.S. Provisional Application No. 61/307,314, filed Feb. 23, 2010, the entire contents of which are hereby incorporated by reference herein.

BACKGROUND

1) Field

Embodiments of the present invention pertain to the field of light-emitting diode fabrication and, in particular, to growth of group III-V material layers by spatially confined epitaxy.

2) Description of Related Art

Group III-V materials are playing an ever increasing role in the semiconductor and related, e.g. light-emitting diode (LED), industries. Often, group III-V materials are difficult to grow or deposit without the formation of defects or cracks. For example, high quality surface preservation of select films, e.g. a gallium nitride film, is not straightforward in many applications. The inclusion of one or more buffer layers between a substrate and a device layer has been one approach receiving much recent attention. However, group III-V materials are often sensitive to ambient conditions and care must be taken to avoid such conditions at particular periods of the fabrication process. Avoiding interaction of a sensitive group III-V film with potential damaging conditions, however, is also not straightforward in many applications.

DETAILED DESCRIPTION

Crack-free growth techniques for forming gallium nitride, and other such related, films are described. In the following description, numerous specific details are set forth, such as fabrication conditions and material regimes, in order to provide a thorough understanding of embodiments of the present invention. It will be apparent to one skilled in the art that embodiments of the present invention may be practiced without these specific details. In other instances, well-known features, such as facility layouts or specific tool configurations, are not described in detail in order to not unnecessarily obscure embodiments of the present invention. Furthermore, it is to be understood that the various embodiments shown in the Figures are illustrative representations and are not necessarily drawn to scale. Additionally, other arrangements and configurations may not be explicitly disclosed in embodiments herein, but are still considered to be within the spirit and scope of the invention.

Conventional growth approaches to forming GaN and related alloys heteroepitaxially on lattice-mismatched substrates (e.g., sapphire, SiC, or even Si substrates) may lead to group III-V films having a high dislocation density and even cracking. Such dislocations and cracking may drastically limit the performance and the lifetime of e.g. GaN-based optoelectronic and electronic devices. For example, in conventional approaches, the typical threading dislocation (TD) density is about ($10^9$-$10^{11}$ $cm^{-2}$) for GaN directly grown on sapphire. Reduction of TD density below $10^8$ $cm^{-2}$ may be achievable with the use of a buffer layer, careful selection of vicinal substrates, or the optimization of growth conditions. Further reduction of TD density below $10^7$ $cm^{-2}$ may also be demonstrated by the adoption of standard epitaxial lateral overgrowth (ELO), two-step or multiple ELO, and even standard or maskless pendeoepitaxy. However, one problem not necessarily addressed by the above approaches with respect to GaN heteroepitaxy is the possibility of cracking due to the large thermal stress formation during thermal cycling, which usually results in dense cracking along the GaN {101-0} planes. For example, particularly for the substrates having a diameter of larger than 3 or 4 inches, cracking has proven to be a severe problem.

As such, disclosed herein are techniques for crack-free growth of GaN, and related, films on larger-size substrates via spatially confined epitaxy. In one embodiment, a crack-free GaN film is formed on substrates with a diameter of or greater than 3 inches via spatially confined epitaxy. Also described herein a crack-free GaN film is disposed on a substrate with a diameter of or greater than 3 inches. In one embodiment, the substrate is a sapphire substrate.

Light-emitting diode (LED) and related devices may be fabricated from layers of, e.g., group III-V films. Embodiments of the present invention relate to the heteroepitaxial growth of crack-free gallium nitride (GaN) films with low dislocation density ($<10^7 cm^{-2}$) on patterned lattice-mismatched substrates, such as sapphire, silicon (Si), and silicon carbide (SiC) with a size of more than 3 or 4 inches, and up to 8 and 12 inches, in diameter. The process in at least some embodiments of the present invention is referred to hereafter as "spatially confined epitaxy" (SCE), which guides the epitaxial growth, e.g. GaN growth, along a pre-patterned substrate with spatially aligned posts. In an embodiment, such an approach provides crack-free, honeycomb-shaped GaN mesas.

In accordance with an embodiment of the present invention, spatially confined epitaxy of GaN is performed on a pre-patterned substrate. In some embodiments, approaches described herein may not entirely avoid crack formation. However, at the very least, any cracks that do form are conducted along certain crystallographic directions. In another embodiment, crack-free growth of GaN is achieved with spatially confined growth with a size of a formed crystal smaller than the average crack distance, e.g., from 100 to several hundred microns. For example, in a particular embodiment, due to the unique hexagonal structure of the Wurtzite form of GaN, a close-packed honeycomb-shaped pattern is used to self-limit the growth laterally. Furthermore, in an embodiment, the subsequent growth of InGaN based light emitting diodes with such high packing density provides a minimization of the waste of junction area, easy cleaving, and enhancement of light extraction from the additional light extraction pathways.

An entire mesa structure (e.g., from 100 to several hundred microns) formed on a patterned substrate may be provided by coalescence of the growth of the mesa structure on smaller-sized substrate posts, e.g., with sizing of 1 to 20 microns in diameter. For example, FIG. 1 illustrates an angled view of a plurality of hexagonal sapphire posts formed in a sapphire substrate, in accordance with an embodiment of the present invention.

Figure 1:
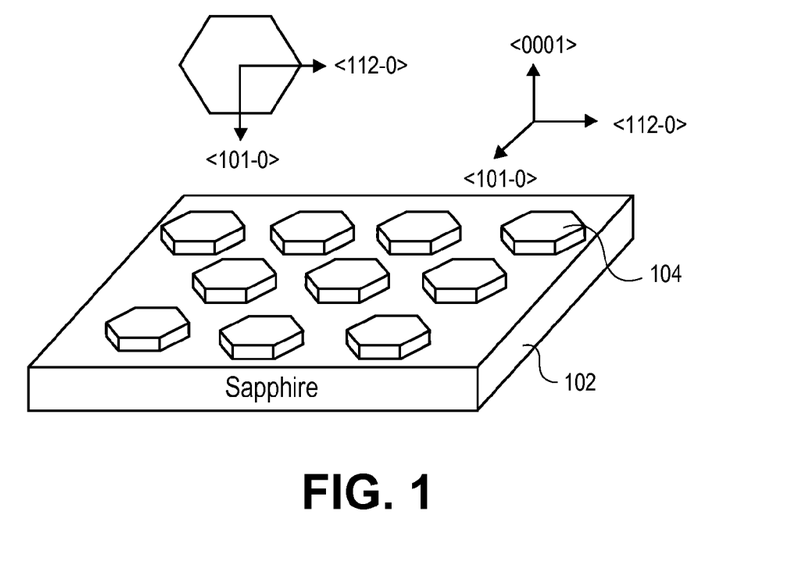
FIG. 1 illustrates an angled view of a plurality of hexagonal sapphire posts formed in a sapphire substrate, in accordance with an embodiment of the present invention.

In an embodiment, referring to FIG. 1, hexagonal-shaped posts 104 on a sapphire substrate 102 are formed by dry-etching techniques using $Cl_2$ or $BCl_3$ based chemistry. For a sapphire substrate, in one embodiment, the side walls of the posts are composed of six equivalent {101-0} planes or tilted planes, such as {101-n}, n=1,2,3 . . . The spacing of the posts may be in a range of approximately 1-10 microns.

A grouping of posts may be used to form a block of GaN film of a desired dimension. For example, FIG. 2 illustrates a plan view of a plurality of blocks of epitaxial GaN, each block formed on a plurality of posts of a sapphire substrate, in accordance with an embodiment of the present invention.

Figure 2:
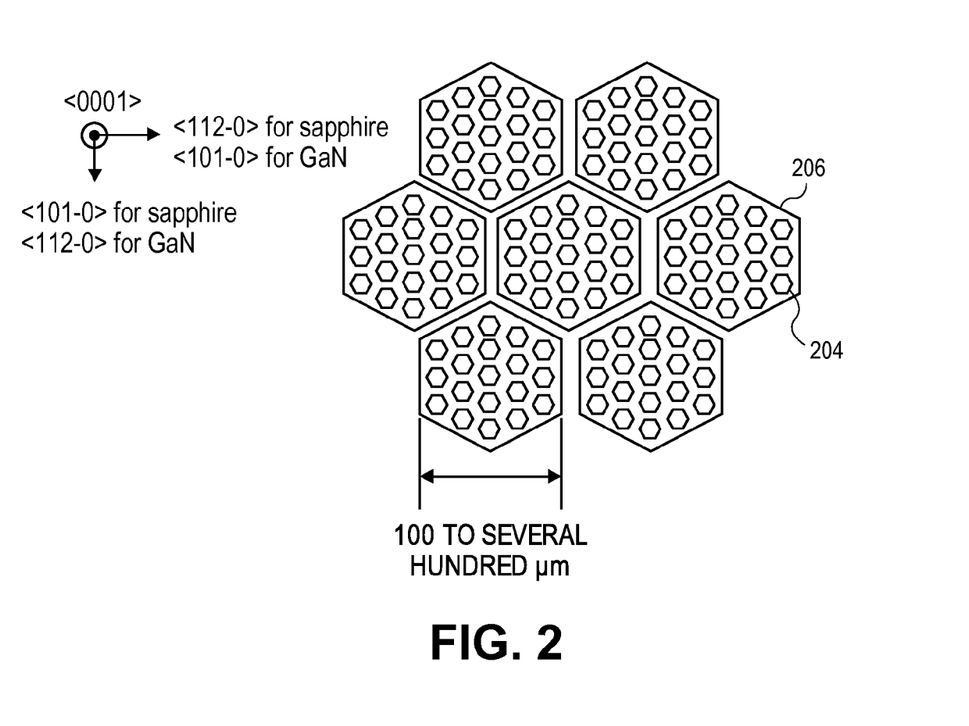
FIG. 2 illustrates a plan view of a plurality of blocks of epitaxial GaN, each block formed on a plurality of posts of a sapphire substrate, in accordance with an embodiment of the present invention

Referring to FIG. 2, a plurality of blocks of epitaxial GaN 206 is provided wherein each block 206 is formed on a plurality of posts 204 of a, e.g., sapphire substrate. In an embodiment, the posts 204 are arranged within a hexagonal-shaped block, with a size of from 100 to several hundred microns, as depicted in FIG. 2. The distance between the blocks 206 may be approximately in the range of 10-20 microns to avoid coalescence of GaN grown from adjacent blocks, as is also depicted in FIG. 2. That is, within a given block 206, posts 204 have a first spacing amongst one another. However, a second spacing, greater than the first spacing, is provided between posts 204 from neighboring blocks of posts. Such an arrangement enables formation of discrete units of GaN, each unit confined to an individual block of posts.

In accordance with an embodiment of the present invention, since the crystallographic relation between epitaxial GaN and an underlying sapphire is GaN {112-0}//Sapphire {101-0}, GaN mesas with {112-0} sidewalls form on top of a sapphire post with {101-01} sidewalls. Accordingly, due to the anisotropic growth rates along the lateral {112-0} or {101-0} directions and the vertical {0001} direction, the initial epitaxy of GaN on the sapphire posts may adopt different shapes, which may be modulated by varying the growth conditions. In one such embodiment, parameters such as temperature, pressure, and V/III precursor ratio are varied. In one embodiment, the composition of the carrier gas (e.g., $H_2$ versus $N_2$) is varied. In one embodiment, the introduction of magnesium (Mg) into the vapor phase is performed.

Figure 3A:
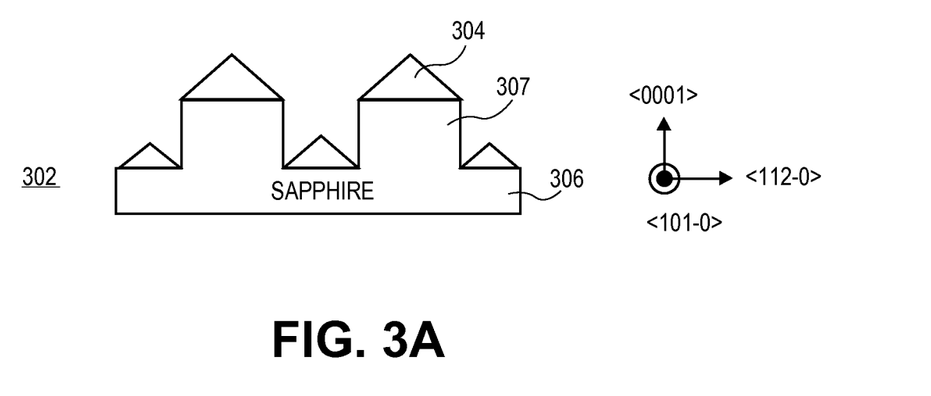
FIGS. 3A-3C illustrate cross-sectional views representing progressive structures in a method of growing crack-free GaN on larger-size substrates via spatially confined epitaxy, in accordance with an embodiment of the present invention.
Figure 3B:
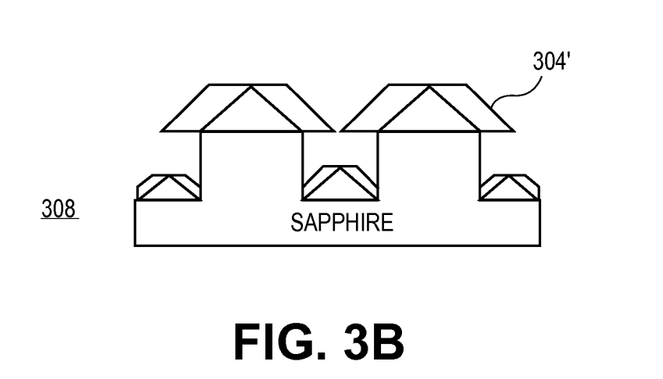
Figure 3C:
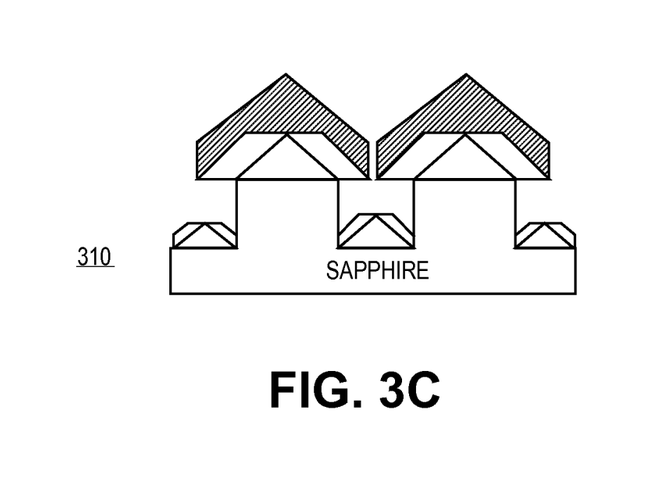
Figure 4:
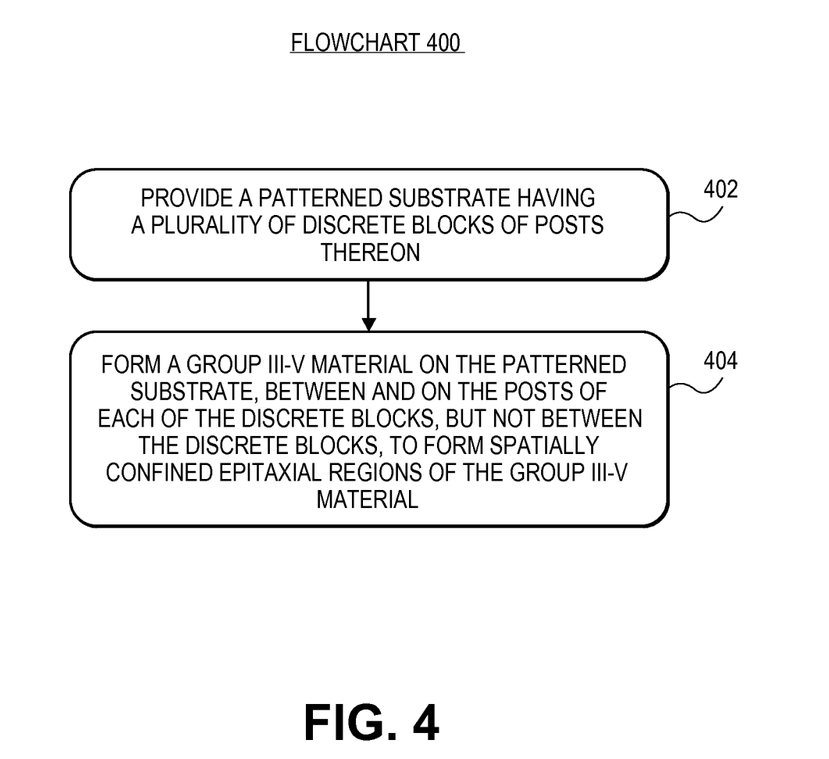
FIG. 4 is a Flowchart representing operations in a method of fabricating a group III-V material on a substrate, in accordance with an embodiment of the present invention.

FIGS. 3A-3C illustrate cross-sectional views representing progressive structures in a method of growing crack-free GaN on larger-size substrates via spatially confined epitaxy, in accordance with an embodiment of the present invention. FIG. 4 is a Flowchart 400 representing operations in a method of fabricating a group III-V material on a substrate, in accordance with an embodiment of the present invention.

Referring to operation 402 of Flowchart 400, a patterned substrate having a plurality of discrete blocks of posts thereon is provided. For example, referring to structure 302 of FIG. 3A, a patterned sapphire substrate 306 has posts 307 formed thereon.

Referring to operation 404 of Flowchart 400, a group III-V material is formed on the patterned substrate, continuous between and on the posts. For example, referring again to structure 302 of FIG. 3A, gallium nitride (GaN) 304 with a pyramidal GaN geometry (bound by six {112-2} planes) is formed on a patterned sapphire substrate 306 under growth conditions preferring high vertical growth rates along {0001}.

Referring to structure 308 of FIG. 3B, next, the lateral growth along {112-0} is enhanced by changing the growth conditions to those preferring lateral growth, providing GaN 304' with a trapezoidal geometry. In one embodiment, this approach enables use of the dislocation bending phenomena to annihilate any threading dislocations, which has been demonstrated in 2S ELO or pendoepitaxy processes. Referring next to structure 310 of FIG. 3B, growth of the GaN material is continued. Thus, preferential vertical and lateral growth is alternated, in accordance with an embodiment of the present invention. The continued growth there from is described in more detail in association with FIGS. 5 and 6 below.

Figure 5:
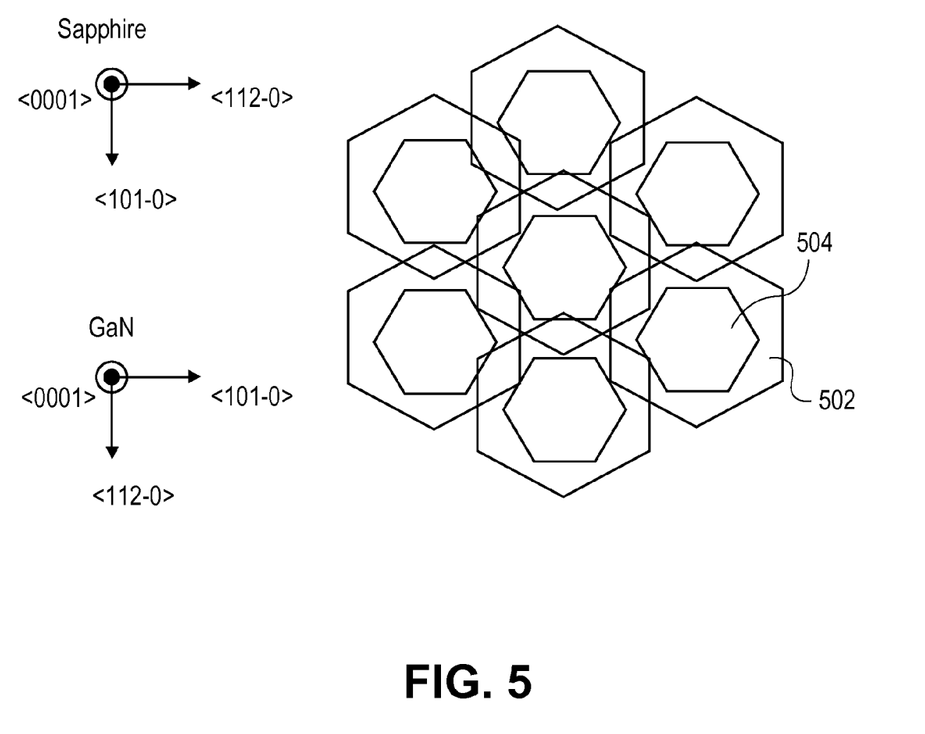
FIG. 5 illustrates a plan view of small GaN mesas, each mesa formed on an individual post, within a block that eventually coalesce along six [112-0] directions with the adjacent GaN mesas, in accordance with an embodiment of the present invention.

In an embodiment, forming the group III-V material on the patterned substrate on the posts of each of the discrete blocks includes forming the group III-V material to coalesce between all of the posts of each of the discrete blocks. For example, FIG. 5 illustrates a plan view of small GaN mesas, each mesa formed on an individual post 504, within a block that eventually coalesces between individual posts along six [112-0] directions with the adjacent GaN mesas, in accordance with an embodiment of the present invention. Referring to FIG. 5, GaN mesas 502 near the edge of the block are bound by {101-1} planes, which form the natural boundaries between the different blocks (note that FIG. 5 only depicts the formation of one such block).

Figure 6:
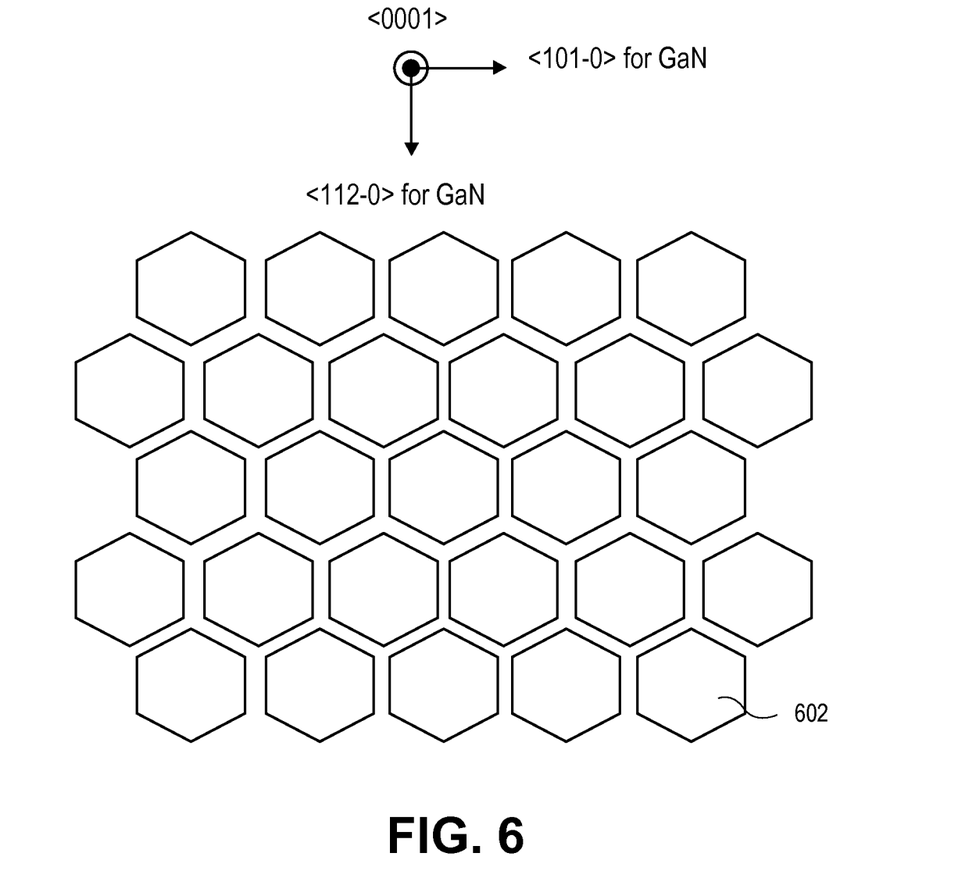
FIG. 6 illustrates a plan view of a plurality of blocks of GaN, each block formed from a plurality of coalesced GaN mesas, each mesa formed on an individual post of a patterned substrate, in accordance with an embodiment of the present invention.

Referring again to operation 404 of Flowchart 400, a group III-V material is formed on the patterned substrate, continuous between and on the posts of each of the discrete blocks, but not continuous between the discrete blocks, to form spatially confined epitaxial regions of the group III-V material. For example, FIG. 6 illustrates a plan view of a plurality of blocks of GaN, each block formed from a plurality of coalesced GaN mesas, each mesa formed on an individual post of a patterned substrate, in accordance with an embodiment of the present invention. In an embodiment, each GaN block 602 of FIG. 6 is formed from high quality, crack-free GaN with low dislocation density GaN mesas formed on posts of a sapphire substrate.

In another embodiment, a silicon (Si) substrate is used, with diameters for the silicon substrate ranging from 3 to 4 inches, up to 8 and 12 inches. In that embodiment, the silicon substrate orientation is selected from {111}, {110}, {100}, or high index surfaces such as {11n} (n=2, 3, etc.), with an off cut angle from less than 0.1 degrees to several degrees. In a particular embodiment, a silicon substrate is etched and patterned to have hexagonal-shaped posts or other shaped blocks which consists of individual posts with smaller size than the size of a desired GaN, or like film, individual block of coalesced mesas.

It is to be understood that in some embodiments of the present invention, blocks of GaN, or related materials, are spaced to avoid coalescence with an adjacent blocks and guide any cracking away from an active surface of the GaN material. Other embodiments contemplated include the use of substrates other than sapphire or silicon (Si) substrates, such as germanium (Ge), silicon carbide (SiC), gallium arsenide (GaAs), zinc oxide (ZnO), lithium aluminum oxide ($\gamma$-LiAlO$_2$). In a specific embodiment, however, the patterned substrate is a (0001) patterned sapphire substrate (PSS). Patterned sapphire substrates may be ideal for use in the manufacturing of LEDs because they increase the light extraction efficiency which is extremely useful in the fabrication of a new generation of solid state lighting devices.

In some embodiments, growth is performed along a (0001) Ga-polarity, N-polarity, or non-polar a-plane {112-0} or m-plane {101-0}, or semi-polar planes. In some embodiments, posts formed in the growth substrate are round, triangular, hexagonal, rhombus shape, or other shapes effective for block-style growth. In an embodiment, the sidewalls of the posts are vertical with straight sidewalls, such as is depicted in FIGS. 3A-3C. Any well know method, such as masking and etching may be utilized to form features, such as the posts described above, from a planar substrate to create a patterned substrate.

However, in another embodiment, the patterned substrate contains a plurality of features (e.g., posts) having a cone shape. In a particular embodiment, the feature has a conical portion and a base portion. In an embodiment of the present invention, the feature has a tip portion with a sharp point to prevent over growth. In an embodiment, the tip has an angle ($\Theta$) of less than 145° and ideally less than 110°. Additionally, in an embodiment, the feature has a base portion which forms a substantially 90° angle with respect to the xy plane of the substrate. In an embodiment of the present invention, the feature has a height greater than one micron and ideally greater than 1.5 microns. In an embodiment, the feature has a diameter of approximately 3.0 microns. In an embodiment, the feature has a diameter height ratio of approximately less than 3 and ideally less than 2. In an embodiment, the features (e.g., posts) within a discrete block of features (e.g., within a block of posts) are spaced apart by a spacing of less than 1 micron and typically between 0.7 to 0.8 microns.

Figure 7:
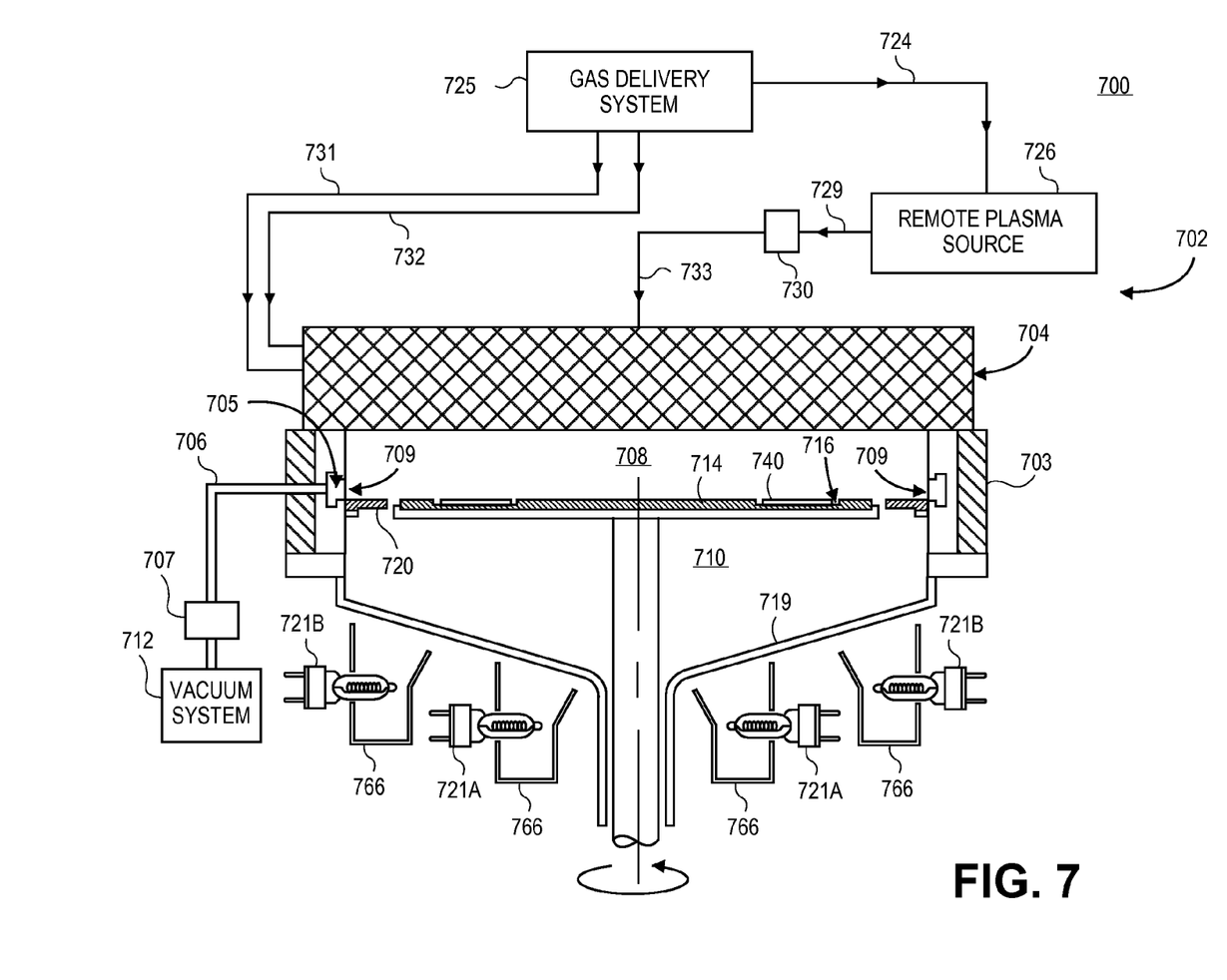
FIG. 7 is a schematic cross-sectional view of an MOCVD chamber, in accordance with an embodiment of the present invention

An example of an MOCVD deposition chamber which may be utilized for crack-free growth of GaN, and related, films on larger-size substrates via spatially confined epitaxy, in accordance with embodiments of the present invention, is illustrated and described with respect to FIG. 7. FIG. 7 is a schematic cross-sectional view of an MOCVD chamber according to an embodiment of the invention. Exemplary systems and chambers that may be adapted to practice the present invention are described in U.S. patent application Ser. No. 11/404,516, filed on Apr. 14, 2006, and Ser. No. 11/429,022, filed on May 5, 2006, both of which are incorporated by reference in their entireties.

The apparatus 700 shown in FIG. 7 includes a chamber 702, a gas delivery system 725, a remote plasma source 726, and a vacuum system 712. The chamber 702 includes a chamber body 703 that encloses a processing volume 708. A showerhead assembly 704 is disposed at one end of the processing volume 708, and a substrate carrier 714 is disposed at the other end of the processing volume 708. A lower dome 719 is disposed at one end of a lower volume 710, and the substrate carrier 714 is disposed at the other end of the lower volume 710. The substrate carrier 714 is shown in process position, but may be moved to a lower position where, for example, the substrates 740 may be loaded or unloaded. An exhaust ring 720 may be disposed around the periphery of the substrate carrier 714 to help prevent deposition from occurring in the lower volume 710 and also help direct exhaust gases from the chamber 702 to exhaust ports 709. The lower dome 719 may be made of transparent material, such as high-purity quartz, to allow light to pass through for radiant heating of the substrates 740. The radiant heating may be provided by a plurality of inner lamps 721A and outer lamps 721B disposed below the lower dome 719, and reflectors 766 may be used to help control chamber 702 exposure to the radiant energy provided by inner and outer lamps 721A, 721B. Additional rings of lamps may also be used for finer temperature control of the substrate 740.

The substrate carrier 714 may include one or more recesses 716 within which one or more substrates 740 may be disposed during processing. The substrate carrier 714 may carry six or more substrates 740. In one embodiment, the substrate carrier 714 carries eight substrates 740. It is to be understood that more or less substrates 740 may be carried on the substrate carrier 714. Typical substrates 740 may include sapphire, silicon carbide (SiC), silicon, or gallium nitride (GaN). It is to be understood that other types of substrates 740, such as glass substrates 740, may be processed. Substrate 740 size may range from 50 mm-100 mm in diameter or larger. The substrate carrier 714 size may range from 200 mm-750 mm. The substrate carrier 714 may be formed from a variety of materials, including SiC or SiC-coated graphite. It is to be understood that substrates 740 of other sizes may be processed within the chamber 702 and according to the processes described herein. The showerhead assembly 704 may allow for more uniform deposition across a greater number of substrates 740 and/or larger substrates 740 than in traditional MOCVD chambers, thereby increasing throughput and reducing processing cost per substrate 740.

The substrate carrier 714 may rotate about an axis during processing. In one embodiment, the substrate carrier 714 may be rotated at about 2 RPM to about 100 RPM. In another embodiment, the substrate carrier 714 may be rotated at about 30 RPM. Rotating the substrate carrier 714 aids in providing uniform heating of the substrates 740 and uniform exposure of the processing gases to each substrate 740.

The plurality of inner and outer lamps 721A, 721B may be arranged in concentric circles or zones (not shown), and each lamp zone may be separately powered. In one embodiment, one or more temperature sensors, such as pyrometers (not shown), may be disposed within the showerhead assembly 704 to measure substrate 740 and substrate carrier 714 temperatures, and the temperature data may be sent to a controller (not shown) which can adjust power to separate lamp zones to maintain a predetermined temperature profile across the substrate carrier 714. In another embodiment, the power to separate lamp zones may be adjusted to compensate for precursor flow or precursor concentration non-uniformity. For example, if the precursor concentration is lower in a substrate carrier 714 region near an outer lamp zone, the power to the outer lamp zone may be adjusted to help compensate for the precursor depletion in this region.

The inner and outer lamps 721A, 721B may heat the substrates 740 to a temperature of about 400 degrees Celsius to about 1200 degrees Celsius. It is to be understood that the invention is not restricted to the use of arrays of inner and outer lamps 721A, 721B. Any suitable heating source may be utilized to ensure that the proper temperature is adequately applied to the chamber 702 and substrates 740 therein. For example, in another embodiment, the heating source may include resistive heating elements (not shown) which are in thermal contact with the substrate carrier 714.

A gas delivery system 725 may include multiple gas sources, or, depending on the process being run, some of the sources may be liquid sources rather than gases, in which case the gas delivery system may include a liquid injection system or other means (e.g., a bubbler) to vaporize the liquid. The vapor may then be mixed with a carrier gas prior to delivery to the chamber 702. Different gases, such as precursor gases, carrier gases, purge gases, cleaning/etching gases or others may be supplied from the gas delivery system 725 to separate supply lines 731, 732, and 733 to the showerhead assembly 704. The supply lines 731, 732, and 733 may include shut-off valves and mass flow controllers or other types of controllers to monitor and regulate or shut off the flow of gas in each line.

A conduit 729 may receive cleaning/etching gases from a remote plasma source 726. The remote plasma source 726 may receive gases from the gas delivery system 725 via supply line 724, and a valve 730 may be disposed between the showerhead assembly 704 and remote plasma source 726. The valve 730 may be opened to allow a cleaning and/or etching gas or plasma to flow into the showerhead assembly 704 via supply line 733 which may be adapted to function as a conduit for a plasma. In another embodiment, apparatus 700 may not include remote plasma source 726 and cleaning/etching gases may be delivered from gas delivery system 725 for non-plasma cleaning and/or etching using alternate supply line configurations to shower head assembly 704.

The remote plasma source 726 may be a radio frequency or microwave plasma source adapted for chamber 702 cleaning and/or substrate 740 etching. Cleaning and/or etching gas may be supplied to the remote plasma source 726 via supply line 724 to produce plasma species which may be sent via conduit 729 and supply line 733 for dispersion through showerhead assembly 704 into chamber 702. Gases for a cleaning application may include fluorine, chlorine or other reactive elements.

In another embodiment, the gas delivery system 725 and remote plasma source 726 may be suitably adapted so that precursor gases may be supplied to the remote plasma source 726 to produce plasma species which may be sent through showerhead assembly 704 to deposit CVD layers, such as III-V films, for example, on substrates 740.

A purge gas (e.g., nitrogen) may be delivered into the chamber 702 from the showerhead assembly 704 and/or from inlet ports or tubes (not shown) disposed below the substrate carrier 714 and near the bottom of the chamber body 703. The purge gas enters the lower volume 710 of the chamber 702 and flows upwards past the substrate carrier 714 and exhaust ring 720 and into multiple exhaust ports 709 which are disposed around an annular exhaust channel 705. An exhaust conduit 706 connects the annular exhaust channel 705 to a vacuum system 712 which includes a vacuum pump (not shown). The chamber 702 pressure may be controlled using a valve system 707 which controls the rate at which the exhaust gases are drawn from the annular exhaust channel 705.

Figure 8:
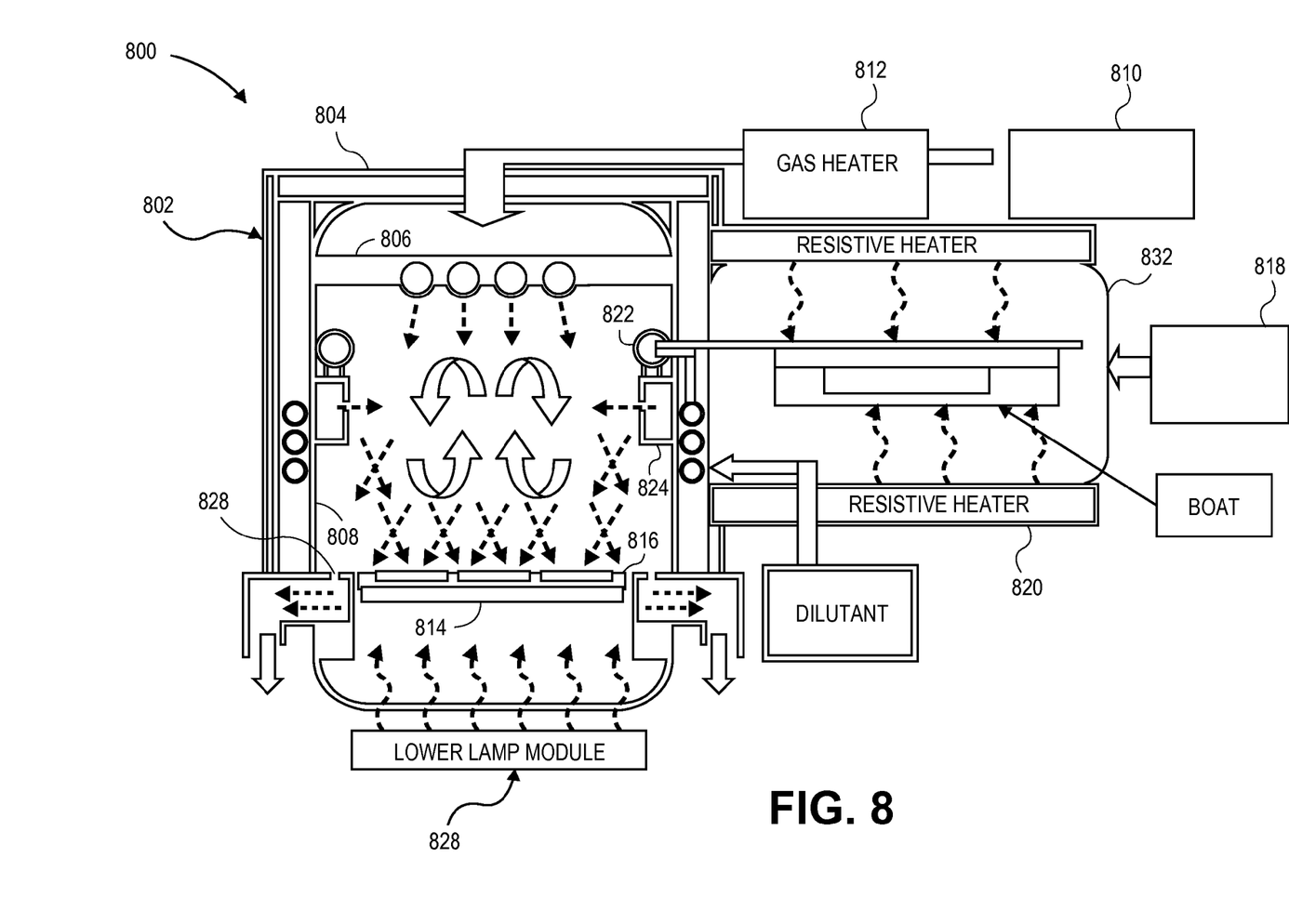
FIG. 8 is a schematic view of an HVPE apparatus, in accordance with an embodiment of the present invention.

An example of a HVPE deposition chamber which may be utilized for crack-free growth of GaN, and related, films on larger-size substrates via spatially confined epitaxy, in accordance with embodiments of the present invention, is illustrated and described with respect to FIG. 8. FIG. 8 is a schematic view of an HVPE apparatus 800 according to one embodiment.

The apparatus 800 includes a chamber 802 enclosed by a lid 804. Processing gas from a first gas source 810 is delivered to the chamber 802 through a gas distribution showerhead 806. In one embodiment, the gas source 810 includes a nitrogen containing compound. In another embodiment, the gas source 810 includes ammonia. In one embodiment, an inert gas such as helium or diatomic nitrogen is introduced as well either through the gas distribution showerhead 806 or through the walls 808 of the chamber 802. An energy source 812 may be disposed between the gas source 810 and the gas distribution showerhead 806. In one embodiment, the energy source 812 includes a heater. The energy source 812 may break up the gas from the gas source 810, such as ammonia, so that the nitrogen from the nitrogen containing gas is more reactive.

To react with the gas from the first source 810, precursor material may be delivered from one or more second sources 818. The precursor may be delivered to the chamber 802 by flowing a reactive gas over and/or through the precursor in the precursor source 818. In one embodiment, the reactive gas includes a chlorine containing gas such as diatomic chlorine. The chlorine containing gas may react with the precursor source to form a chloride. In order to increase the effectiveness of the chlorine containing gas to react with the precursor, the chlorine containing gas may snake through the boat area in the chamber 832 and be heated with the resistive heater 820. By increasing the residence time that the chlorine containing gas is snaked through the chamber 832, the temperature of the chlorine containing gas may be controlled. By increasing the temperature of the chlorine containing gas, the chlorine may react with the precursor faster. In other words, the temperature is a catalyst to the reaction between the chlorine and the precursor.

In order to increase the reactivity of the precursor, the precursor may be heated by a resistive heater 820 within the second chamber 832 in a boat. The chloride reaction product may then be delivered to the chamber 802. The reactive chloride product first enters a tube 822 where it evenly distributes within the tube 822. The tube 822 is connected to another tube 824. The chloride reaction product enters the second tube 824 after it has been evenly distributed within the first tube 822. The chloride reaction product then enters into the chamber 802 where it mixes with the nitrogen containing gas to form a nitride layer on a substrate 816 that is disposed on a susceptor 814. In one embodiment, the susceptor 814 includes silicon carbide. The nitride layer may include n-type gallium nitride for example. The other reaction products, such as nitrogen and chlorine, are exhausted through an exhaust 826.

A group III-nitride layer fabricated by spatially confined epitaxy may be used in the fabrication of a light-emitting diode device. For example, FIG. 9 illustrates a cross-sectional view of a gallium nitride (GaN)-based light-emitting diode (LED), in accordance with an embodiment of the present invention.

Figure 9:
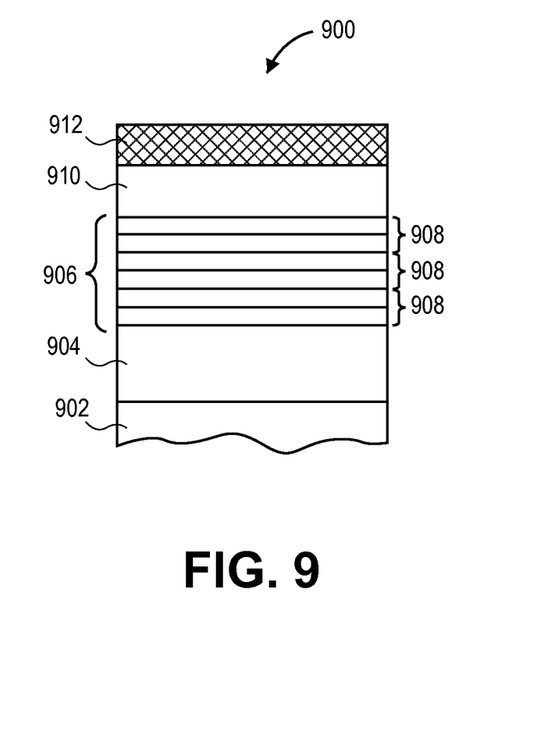
FIG. 9 illustrates a cross-sectional view of a gallium nitride (GaN)-based light-emitting diode (LED), in accordance with an embodiment of the present invention.

Referring to FIG. 9, a GaN-based LED 900 includes an n-type GaN template 904 (e.g., n-type GaN, n-type InGaN, n-type AlGaN, n-type InAlGaN) on a substrate 902 (e.g., planar sapphire substrate, patterned sapphire substrate (PSS), silicon substrate, silicon carbide substrate). The GaN-based LED 900 also includes a multiple quantum well (MQW), or active region, structure or film stack 906 on or above the n-type GaN template 904 (e.g., an MQW composed of one or a plurality of field pairs of InGaN well/GaN barrier material layers 908, as depicted in FIG. 9). The GaN-based LED 900 also includes a p-type GaN (p-GaN) layer or film stack 910 on or above the MQW 906, and a metal contact or ITO layer 912 on the p-GaN layer.

LEDs and related devices may be fabricated from layers of, e.g., group III-V films, especially group III-nitride films. Some embodiments of the present invention relate to forming gallium nitride (GaN) layers in a dedicated chamber of a fabrication tool, such as in a dedicated MOCVD chamber. In some embodiments of the present invention, GaN is a binary GaN film, but in other embodiments, GaN is a ternary film (e.g., InGaN, AlGaN) or is a quaternary film (e.g., InAlGaN). In at least some embodiments, the group III-nitride material layers are formed epitaxially. They may be formed directly on a substrate or on a buffers layer disposed on a substrate.

It is to be understood that embodiments of the present invention need not be limited to GaN as a group III-V layer formed on a patterned substrate. For example, other embodiments may include any Group III-Nitride epitaxial film that can be suitably deposited by hydride vapor phase epitaxy or MOCVD, or the like, deposition. The Group III-Nitride film may be a binary, ternary, or quaternary compound semiconductor film formed from a group III element or elements selected from gallium, indium and aluminum and nitrogen. That is, the Group III-Nitride crystalline film can be any solid solution or alloy of one or more Group III element and nitrogen, such as but not limited to GaN, AlN, InN, AlGaN, InGaN, InAlN, and InGaAlN. In a specific embodiment, the Group III-Nitride film is a gallium nitride (GaN) film. The Group III-Nitride film can have a thickness between 2-500 microns and is typically formed between 2-15 microns. Thicknesses greater than 500 microns are possible because of, e.g., the high growth rate of HYPE. In an embodiment of the present invention, the Group III-Nitride film has a thickness of at least 3.0 microns to sufficiently suppress threading dislocations. Additionally, the Group III-Nitride film can be doped or undoped. The Group III-Nitride film can be p-typed doped using any p type dopant such as but not limited Mg, Be, Ca, Sr, or any Group I or Group II element have two valence electrons. The Group III-Nitride film can be p type doped to a conductivity level of between $1 \times 10^{16}$ to $1 \times 10^{20}$ atoms/cm$^3$. The Group III-Nitride film can be n type doped using any n type dopant such as but not limited to Si, Ge, Sn, Pb, or any suitable Group IV, Group V, or Group VI element. The Group III-Nitride film can be n type doped to a conductivity level of between $1 \times 10^{16}$ to $1 \times 10^{20}$ atoms/cm$^3$.

It is to be understood that on the above processes may be performed in a dedicated chamber within a cluster tool, or other tool with more than one chamber, e.g. an in-line tool arranged to have a dedicated chamber for fabricating layers of an LED. It is also to be understood that embodiments of the present invention need not be limited to the fabrication of LEDs. For example, in another embodiment, devices other than LED devices may be fabricated by approaches described herein, such as but not limited to field-effect transistor (FET) devices. In such embodiments, there may not be a need for a p-type material on top of a structure of layers. Instead, an n-type or un-doped material may be used in place of the p-type layer.

Thus, techniques for crack-free growth of GaN, and related, films on larger-size substrates via spatially confined epitaxy have been disclosed. In accordance with an embodiment of the present invention, a crack-free GaN film is formed on substrates with a diameter of or greater than 3 inches via spatially confined epitaxy. In accordance with an embodiment of the present invention, a crack-free GaN film is disposed on a substrate with a diameter of or greater than 3 inches. In one embodiment, the substrate is a sapphire substrate.

What is claimed is:

1. A method for fabricating a group III-V material on a substrate, the method comprising:
providing a patterned substrate having a plurality of discrete blocks of posts thereon; and
forming a group III-V material on the patterned substrate, continuous between and on the posts of each of the discrete blocks, but not continuous between the discrete blocks, to form spatially confined epitaxial regions of the group III-V material.

2. The method of claim 1, wherein forming the group III-V material on the patterned substrate on the posts of each of the discrete blocks comprises forming the group III-V material to coalesce between all of the posts of each of the discrete blocks.

3. The method of claim 1, wherein a crack-free GaN film is formed on the patterned substrate with a diameter of or greater than 3 inches.

4. The method of claim 3, wherein the patterned substrate is a patterned sapphire substrate.

5. The method of claim 3, wherein the patterned substrate is a patterned silicon substrate.

6. The method of claim 1, wherein the posts within a block are spaced apart at a distance smaller than the distance between outer most posts in neighboring blocks.

7. The method of claim 6, wherein the posts of the block form a hexagonal pattern.

8. The method of claim 7, wherein the posts of the block each have vertical sidewalls.

9. An apparatus, comprising:
a patterned substrate having a plurality of discrete blocks of posts thereon; and
a group III-V material disposed on the patterned substrate, continuous between and on the posts of each of the discrete blocks, but not continuous between the discrete blocks, to provide spatially confined epitaxial regions of the group III-V material.

10. The apparatus of claim 9, wherein the posts within a block are spaced apart at a distance smaller than the distance between outer most posts in neighboring blocks.

11. The apparatus of claim 10, wherein the posts of the block form a hexagonal pattern.

12. The apparatus of claim 9, wherein the patterned substrate is a patterned sapphire substrate.

13. A substrate having a group III-V material disposed thereon, comprising:
a patterned substrate having a diameter of or greater than 3 inches; and
a crack-free gallium nitride (GaN) film disposed on the patterned substrate.

14. The substrate having the group III-V material disposed thereon of claim 13, wherein the patterned substrate is a patterned sapphire substrate.

15. The substrate having the group III-V material disposed thereon of claim 13, wherein the patterned substrate is a patterned silicon substrate.

16. The substrate having the group III-V material disposed thereon of claim 13, wherein the patterned substrate comprises a plurality of posts.

17. The substrate having the group III-V material disposed thereon of claim 16, wherein the plurality of posts comprises blocks of posts.

18. The substrate having the group III-V material disposed thereon of claim 17, wherein the posts within a block are spaced apart at a distance smaller than the distance between outer most posts in neighboring blocks.

19. The substrate having the group III-V material disposed thereon of claim 18, wherein the posts of the block form a hexagonal pattern.

20. The substrate having the group III-V material disposed thereon of claim 19, wherein the posts of the block each have vertical sidewalls.

* * * * *